United States Patent [19]

Mori

[11] Patent Number: 5,644,383
[45] Date of Patent: Jul. 1, 1997

[54] SCANNING EXPOSURE APPARATUS AND DEVICE MANUFACTURING METHOD USING THE SAME

[75] Inventor: Tetsuzo Mori, Atsugi, Japan

[73] Assignee: Canon Kabushiki Kaisha, Tokyo, Japan

[21] Appl. No.: 338,777

[22] Filed: Nov. 10, 1994

[30] Foreign Application Priority Data

Nov. 11, 1993 [JP] Japan .................... 5-282573

[51] Int. Cl.⁶ ........................... G03B 27/42; G03B 27/74
[52] U.S. Cl. ............................ 355/68; 355/53
[58] Field of Search ................. 355/53, 67, 68, 355/69, 71

[56] References Cited

U.S. PATENT DOCUMENTS

| | | | |
|---|---|---|---|
| 4,370,026 | 1/1983 | Dubroeucq et al. | 355/71 X |
| 4,711,568 | 12/1987 | Torigoe et al. | 355/68 |
| 4,822,975 | 4/1989 | Torigoe | 219/121.85 |
| 4,851,978 | 7/1989 | Ichihara | 355/67 X |
| 4,884,101 | 11/1989 | Tanimoto | 355/68 |
| 4,947,047 | 8/1990 | Muraki | 250/492.2 |
| 4,970,546 | 11/1990 | Suzuki et al. | 355/53 |
| 4,974,919 | 12/1990 | Muraki et al. | 350/6.6 |
| 5,053,614 | 10/1991 | Yui et al. | 250/205 |
| 5,097,291 | 3/1992 | Suzuki | 355/69 |
| 5,107,275 | 4/1992 | Tsuruoka et al. | 346/1.1 |
| 5,119,390 | 6/1992 | Ohmori | 372/25 |
| 5,171,965 | 12/1992 | Suzuki et al. | 219/121.6 |
| 5,191,374 | 3/1993 | Hazama et al. | 355/53 X |
| 5,250,797 | 10/1993 | Sano et al. | 250/205 |
| 5,343,270 | 8/1994 | Sakakibara et al. | 355/53 |
| 5,473,412 | 12/1995 | Ozawa | 355/53 X |

*Primary Examiner*—Fred L. Braun
*Attorney, Agent, or Firm*—Fitzpatrick, Cella, Harper & Fitzpatrick

[57] ABSTRACT

A scanning exposure apparatus includes a supplying system for supplying exposure light to a substrate to be scanned in a direction. The exposure light has a predetermined intensity distribution in the direction of scan, a detecting device for detecting the light quantity of the exposure light, and a control system for controlling the supplying system on the basis of the light quantity and the predetermined intensity distribution of the exposure light.

20 Claims, 8 Drawing Sheets

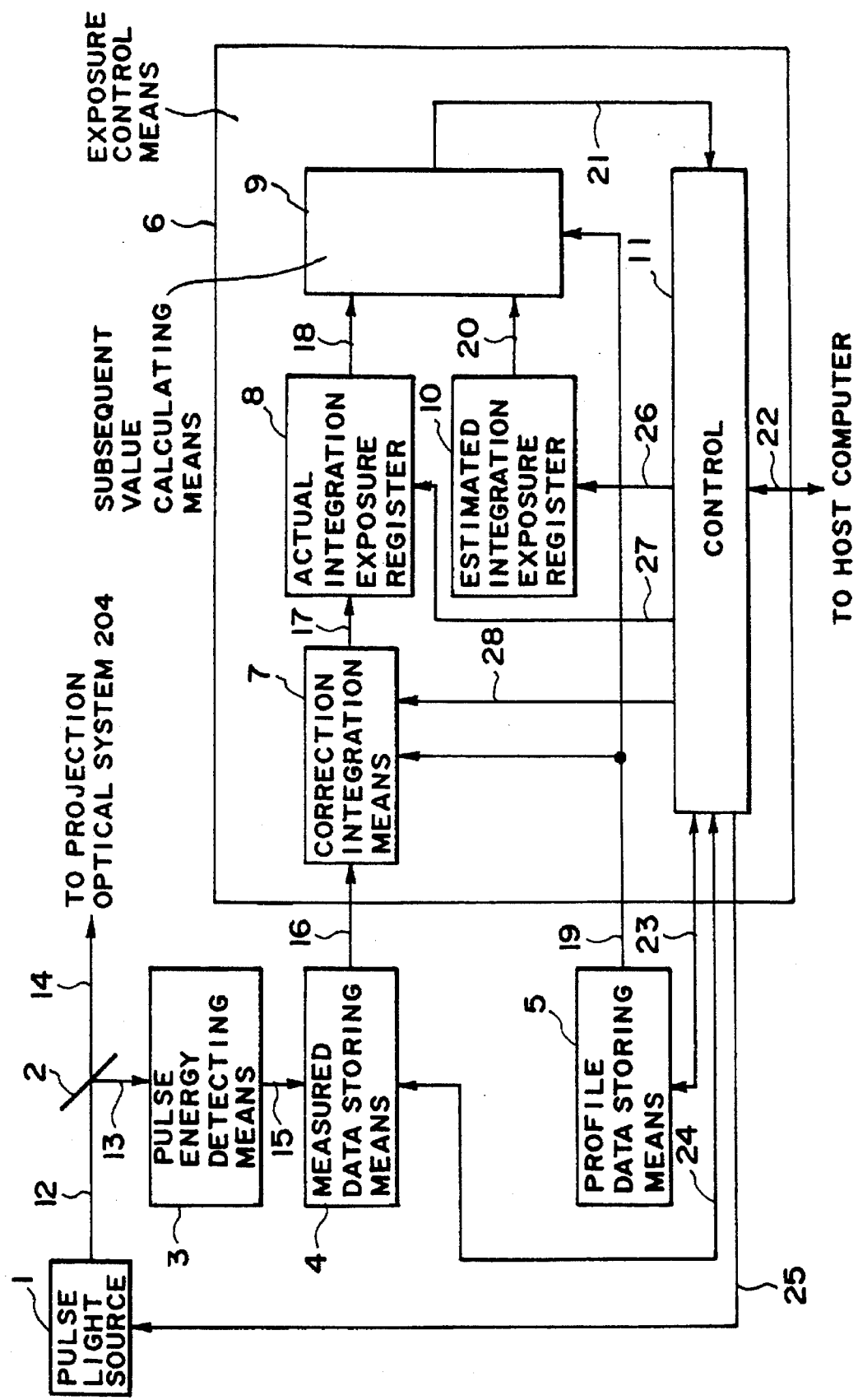
FIG. I

1

SCANNING EXPOSURE APPARATUS AND DEVICE MANUFACTURING METHOD USING THE SAME

FIELD OF THE INVENTION AND RELATED ART

This invention relates to a scanning exposure apparatus and a device manufacturing method using the same. More particularly, the invention is concerned with a scan type exposure apparatus suitably usable for manufacture of devices such as semiconductor chips (e.g., ICs or LSIs), sensors (e.g., magnetic heads), display devices (e.g., liquid crystal panels) or image pickup devices (e.g., CCDs), and also to a device manufacturing method for manufacturing devices such as described by using a scanning exposure apparatus.

A known type scanning exposure apparatus is arranged generally to project a portion of a reticle onto a corresponding portion of a wafer through a projection optical system and, by moving the reticle and the wafer simultaneously in a scan direction relatively to the projection optical system, different portions of the reticle are projected and transferred to corresponding portions of the wafer, respectively.

A known example of such scanning exposure apparatus uses a pulse light source such as an excimer laser, for example, as its light source for exposure process. Since light pulses from such a pulse light source are varying in intensity, it is a problem in a scanning exposure apparatus with a pulse light source that the exposure amounts in different portions of a wafer are not uniform.

SUMMARY OF THE INVENTION

It is accordingly an object of the present invention to provide an improved scanning exposure apparatus by which a substrate (such as a wafer) to be exposed can be exposed with uniform exposure amount.

It is another object of the present invention to provide a device manufacturing method in which a substrate (such as a wafer) to be exposed can be exposed with uniform exposure amount.

In accordance with a first aspect of the present invention, there is provided a scanning exposure apparatus, comprising: supplying means for supplying exposure light to a substrate to be scanned in a direction, wherein the exposure light has a predetermined intensity distribution in the direction of scan; detecting means for detecting light quantity of the exposure light; and control means for controlling said supplying means on the basis of the light quantity and the predetermined intensity distribution of the exposure light.

In accordance with a second aspect of the present invention, there is provided a scanning exposure apparatus, comprising: supplying means for supplying exposure light to a substrate to be scanned in a direction, wherein the exposure light has a predetermined intensity distribution in the direction of scan; detecting means for detecting light quantity of the exposure light; and control means for detecting the amount of exposure of the substrate on the basis of the light quantity and the predetermined intensity distribution, and for controlling the exposure through said supplying means on the basis of a difference between the detected exposure amount and a desired exposure amount to be attained.

In accordance with a third aspect of the present invention, there is provided a scanning exposure apparatus for scanning a mask and a substrate in a direction and with a plurality of light pulses to expose the substrate to the mask, said apparatus comprising: irradiating means projecting light pulses to the mask sequentially, wherein each light pulse has a predetermined intensity distribution in the direction of scan; detecting means for detecting light quantity of the light pulses; and control means for detecting the integrated exposure amount of the substrate with the light pulses on the basis of the light quantity and the predetermined light intensity, and for controlling said irradiating means on the basis of a difference between the detected integrated exposure amount and a desired exposure amount to be attained.

In accordance with a fourth aspect of the present invention, there is provided a device manufacturing method for manufacturing a device by using a scanning exposure apparatus as recited in any one of the first to third aspects.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view of a scanning exposure apparatus according to an embodiment of the present invention.

FIGS. 2A, 2B and 2C are illustrations for explaining the FIG. 1 embodiment, wherein FIG. 2A is a schematic view of the scanning exposure apparatus, FIG. 2B is an enlarged plan view of an exposure region on a reticle of FIG. 2A, and FIG. 2C is an enlarged plan view of an exposure region on a wafer of FIG. 2A.

DESCRIPTION OF THE PREFERRED EMBODIMENTS

FIG. 1 shows an embodiment of the present invention, and specifically it illustrates an exposure amount controlling system in a device manufacturing scanning projection exposure apparatus.

Figure 2A:
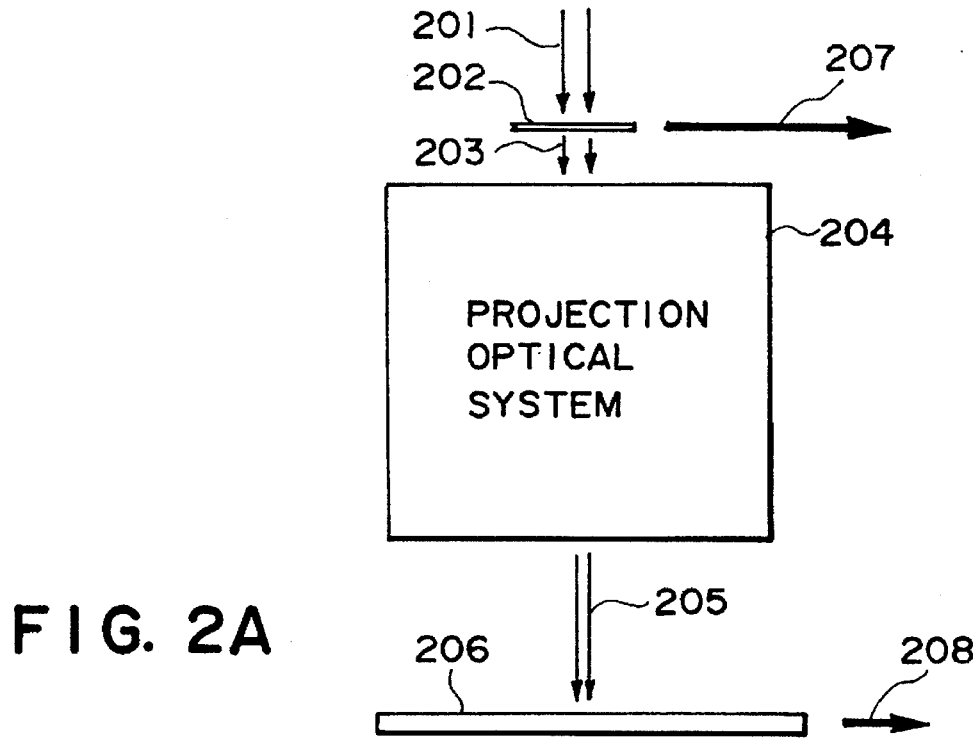
Figure 2B:
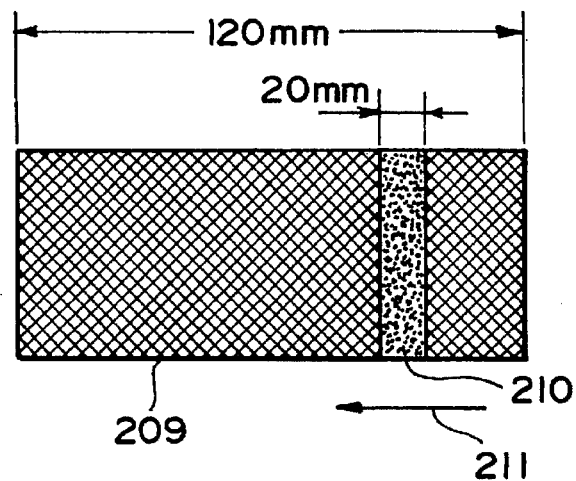
Figure 2C:
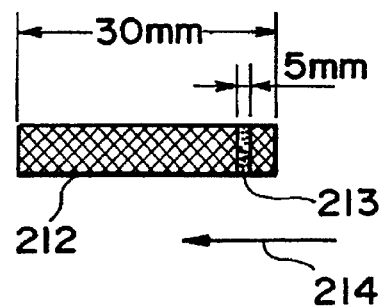

FIGS. 2A–2C are views for explaining this embodiment, wherein FIG. 2A is a schematic view of the scanning exposure apparatus, FIG. 2B is an enlarged view of an exposure region on a reticle of FIG. 2A, and FIG. 2C is an enlarged view of an exposure region on a wafer of FIG. 2A.

In FIG. 2A, denoted at 201 is exposure light emitted from a pulse light source. Denoted at 202 is a reticle, denoted at 203 is the exposure light passing through the reticle, and denoted at 204 is a projection optical system of a magnification of ¼. Denoted at 205 is the exposure light impinging on a semiconductor wafer which is denoted at 206. Denoted at 207 is an arrow which depicts the direction of scan of the reticle, and denoted at 208 is an arrow which represents the direction of scan of the wafer.

In FIG. 2B, denoted at 209 is a pattern region of the reticle, denoted at 210 is an irradiation region to be irradiated with the exposure light, and denoted at 211 is an arrow which represents the movement direction of the irradiation region, that is, the scan direction.

In FIG. 2C, denoted at 212 is a pattern region of the wafer, denoted at 213 is an irradiation region to be irradiated with the exposure light, and denoted at 214 is an arrow which represents the movement direction of the irradiation region, that is, the scan direction.

The reticle 202 is scanned in synchronism with the scan of the wafer 206, and the exposure light 205 defines an irradiation region 213 on the wafer 206, by which a pattern of the reticle 202 is imaged thereon. As the reticle 202 is scanningly moved in the direction of arrow 207 and the wafer 206 is scanningly moved in the direction of arrow 208, the region 210 of the reticle 202 relatively moves within the pattern region 209 in the direction of arrow 211. In synchronism with this motion, the region 213 of the wafer 206 moves relatively within the pattern region 212 in the direction of arrow 214. By this, the pattern of the reticle 202 is transferred onto the pattern region 212 on the wafer 206.

Referring back to FIG. 1, denoted at 1 is a pulse light source (such as an excimer laser) for supplying exposure light. Denoted at 2 is a beam splitter, and denoted at 3 is a pulse energy detecting means for measuring the energy (light quantity) of each pulse from the pulse light source. Denoted at 4 is a data storage means for memorizing the measured pulse energy as data, and denoted at 5 is a profile data storage means for memorizing an illuminance distribution on the irradiation region 210 of the reticle 202 with respect to the scan direction (i.e., light intensity distribution of exposure light with respect to a section in the scan direction). Denoted at 6 is an exposure controlling means, and denoted at 7 is a correction integration means for correcting the pulse light energy data of the pulse light source 1 on the basis of the illuminance distribution profile data and for integrating the corrected data.

Denoted at 8 is an actual integration exposure amount register for temporally storing the exposure amount during the exposure process, and denoted at 9 is a succeeding level calculating means for calculating a desired level of the succeeding pulse light energy to be emitted by the pulse light source 1. Denoted at 10 is an estimated integration quantity register for storing a value which is predetermined with respect to the exposure amount in accordance with a process parameter related to a used resist, for example. Denoted at 11 is a control means for controlling the exposure operation, denoted at 12 is a light beam emitted by the pulse light source 1, and denoted at 13 and 14 each is a portion of the light beam 12.

Denoted at 15 is measured data, being measured by the pulse energy detecting means 3, and denoted at 16 is measured data, being read out from the measured data storage means 4 as required. Denoted at 17 is integrated light quantity data, denoted at 18 is actual integration exposure amount data, and denoted at 19 is profile data, being read out as required. Denoted at 20 is estimated integration exposure amount data, and denoted at 21 is succeeding emission light intensity data.

Denoted at 22 is a communication line to a host computer, for attaining synchronism with other subsidiary units of the exposure apparatus, and denoted at 23 is a control signal to be applied to the profile data storage means 5. Denoted at 24 is a control signal to be applied to the measured data storage means 4, denoted at 25 is a control signal to be applied to the pulse light source 1, and denoted at 26 is a control signal to be applied to the estimated integration exposure amount register. Denoted at 27 is a control signal to be applied to the actual integration exposure amount register, and denoted at 28 is a control signal to be applied to the correction and integration means.

Light beam 12 emitted by the pulse light source 1 is divided by the beam splitter 2 into a light beam 13 and a light beam 14. The light beam 14 is directed to the reticle 202 (FIG. 2), the projection optical system 204 and the wafer 206. The light beam 13 is directed to the pulse energy detecting means 3 by which the pulse energy of each pulse is measured. The measured data storage means 4 receives each measured data from the pulse energy detecting means 3 and stores it therein.

Intermittent time moments $T_n$ are now defined. The suffix "n" is an integer, and an increase of the number n indicates lapse of time. The intervals between $T_n$ and $T_{n+1}$ are substantially constant. It is assumed that the pulse light source 1 emits light at substantially regular intervals (periodicity), and the time moments of light emission correspond to the moments $T_n$, respectively. Since each light emission period (duration) is very short, it can be represented by time moment $T_n$.

If the current time moment is denoted by $t_g$ which can be expressed by:

$$T_{n-1} < t_g < T_n \qquad (1)$$

then, in response to a signal from the control means 11, the correction and integration means 7 reads latest data of a number "x" out of the measured data storage means 4. Namely, it reads out the pulse energy data corresponding to the time moments $T_{n-x}$, $T_{n-x+1}$, ... and $T_{n-1}$, respectively. The thus read data are used to calculate the integrated exposure amount (data 17) with respect to a certain point within a predetermined exposure region, while using the profile data in the profile data storage means 5 as a correction coefficient. The data 17 is temporally stored in the actual integration exposure amount register 8. On the other hand, estimated integration exposure amount data with respect to a representative point, corresponding to the pulses of a number "x", are stored previously into the estimated integration exposure amount register 10, by means of the control means. Namely, data of integrated exposure amount being predicted as received by that representative point from time moment $T_{n-x}$ to time moment $T_{n-1}$, has been memorized. The succeeding level calculating means 9 serves to calculate the level of succeeding emission light pulse energy to be emitted, on the basis of a difference (remainder) determined by subtracting the actual integration exposure amount data 18 from the estimated integration exposure amount data 20, the result being transmitted to the control means 11. More specifically, the calculating means calculates the energy level of the pulse light from the pulse light source 1 at the moment $T_n$, by adding the difference to a predetermined level. Then, the control means 11 supplies, to the pulse light source 1, a control signal 25 which is a command for emission of light corresponding to the received emission light pulse energy. The sequential operation described above is repeated the necessary number of times, as required to accomplish uniform exposure over the whole surface of the wafer 206. Upon completion of the repetition, the exposure process is finished.

The numerical value "x" referred to above will now be referred to as "correction range". The value of "x" may be determined, for example, by the illuminance distribution profile in the irradiation region on the reticle 202 in the scan direction 211, the width of the irradiation region 210 on the reticle 202 in the scan direction 211, the frequency of light emitted by the pulse light source 1, the scan speed of the reticle 202 (stage) and the degree of variation in energy of emitted light from the pulse light source 1. The range to be taken as the correction range x may be determined as follows:

$$0 < x < D \cdot f/v \quad (2)$$

where D is the width of the irradiation region 210 on the reticle 202 in the scan direction 211, f is the frequency of light emitted by the pulse light source 1, and v is the scan speed of the reticle 202.

Figure 3:
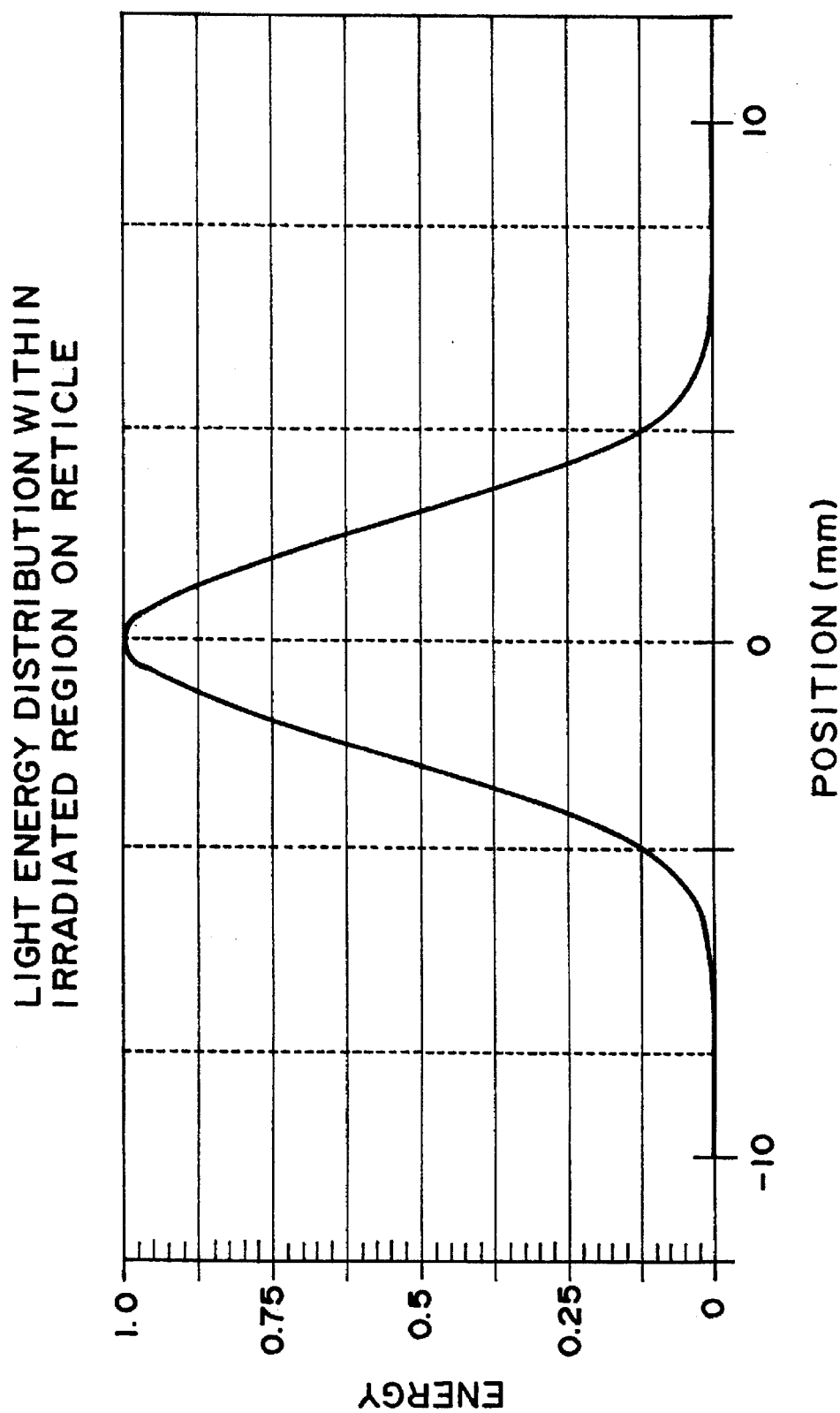
FIG. 3 is an illustration for explaining an illuminance distribution profile in the scan direction of an irradiation region on a reticle, in the embodiment of FIG. 1.
Figure 4:
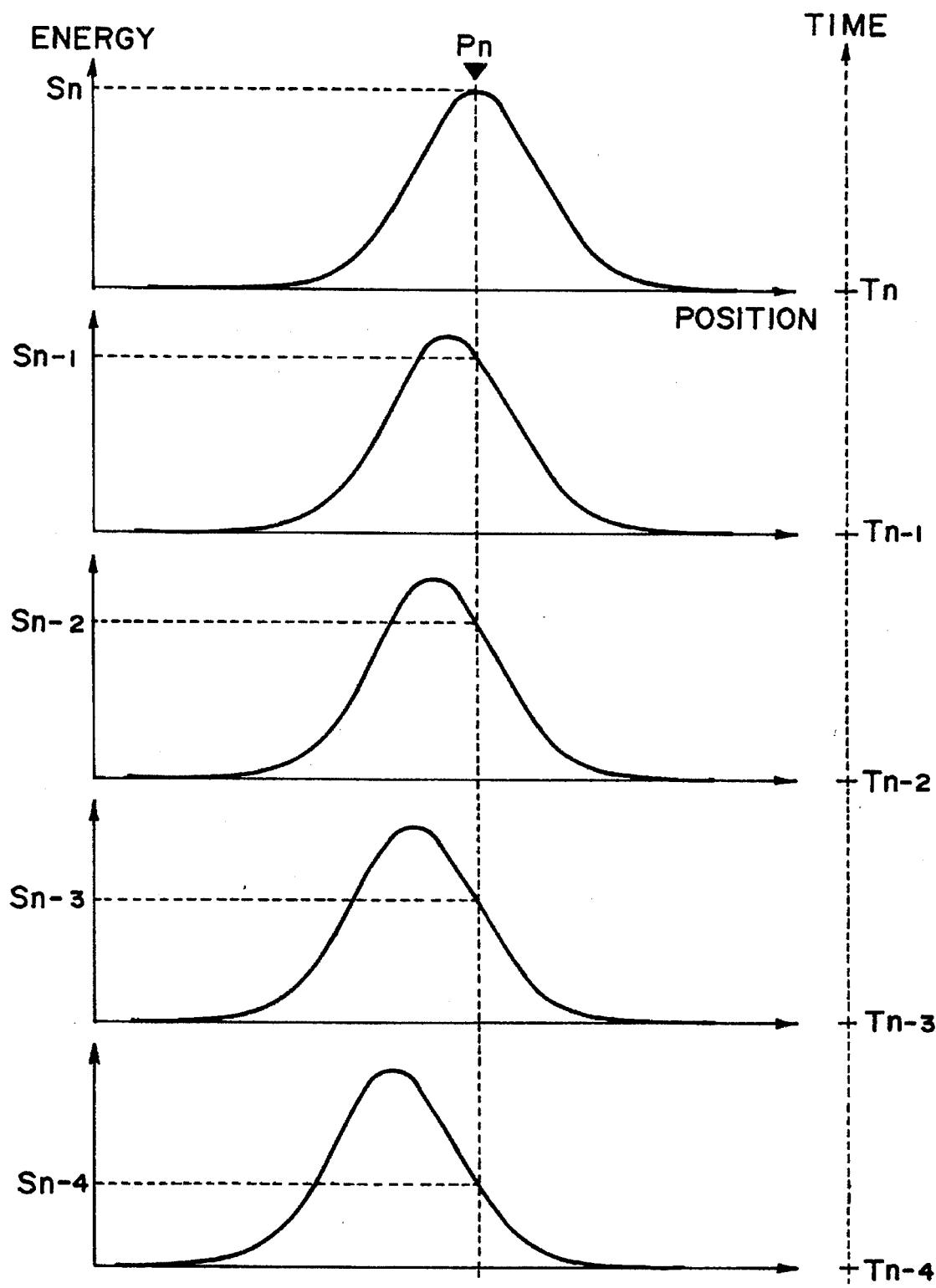
FIG. 4 is an illustration for explaining the exposure process with respect to one point on a reticle.

FIG. 3 illustrates the profile of illuminance distribution in the irradiation region 210 of the reticle 202 in the scan direction 211. FIG. 4 illustrates the exposure process to a certain point (as described) on the reticle 202. The illuminance distribution in the irradiation region 210 of the reticle with respect to the scan direction 211 is now assumed as being a Gaussian distribution such as shown in FIG. 3. In this embodiment, for simplicity of explanation, it is also assumed that the width of the irradiation region 210 of the reticle 202 is taken as 20 mm, and that the Gaussian illumination distribution has a peak illuminance at the middle of the irradiation region and has zero points at its opposite ends. The scanning exposure operation using a number of pulses each having such illuminance distribution will now be explained in conjunction with FIG. 4.

In FIG. 4, denoted respectively at $T_{n-4}$, $T_{n-3}$, $T_{n-2}$, $T_{n-1}$ and $T_n$ are light emission time moments of emission of a series of pulse lights from the pulse light source 1. The current time moment is $t_g$ as can be expressed by equation (1). Denoted at $P_n$ is a certain point (as described) on the reticle 202, which point will come to the middle of the irradiation region at the moment of exposure by a pulse light at time moment $T_n$. Denoted respectively at $S_{n-4}$, $S_{n-3}$, $S_{n-2}$, $S_{n-1}$ and $S_n$ are illuminances (light quantities) at the point $P_n$ at the respective light emission time moments. These quantities $S_{n-4}$, $S_{n-3}$, $S_{n-2}$, $S_{n-1}$ and $S_n$ may be determined on the basis of the data stored in the profile data storage means 5, the data stored in the measured data storage means 4 and the positional information about the reticle and the wafer. At the time moment $t_g$, the point $P_n$ has already been exposed by light pulses of a number of about a half of a predetermined number of light pulses to be projected thereto. FIG. 4 illustrates only the latest four exposures by light quantities $S_{n-4}$, $S_{n-3}$, $S_{n-2}$, and $S_{n-1}$. In this embodiment, an error in integrated exposure amount at the point $P_n$ as provided by the pulse exposures prior to the time moment $t_g$, is corrected by the pulse light exposure at the time moment $T_n$, and the energy of pulse light from the pulse light source 1 is adjusted to do so. Namely, the succeeding pulse exposure $S_n$ is carried out with a pulse light as determined by adding, to a predetermined light quantity, a light quantity for correcting the above-described error. Since in this embodiment the exposure light has an intensity distribution of a Gaussian distribution shape with respect to the scan direction, this corrective exposure is done with notice to the middle of the irradiation region 210 of the light emission time moments, with respect to the scan direction. However, the present invention is not limited to this, particularly in cases where the exposure light has a different intensity distribution as of a trapezoidal shape. In this embodiment, the above-described corrective exposure is effected with respect to each point on the reticle.

Figure 5:
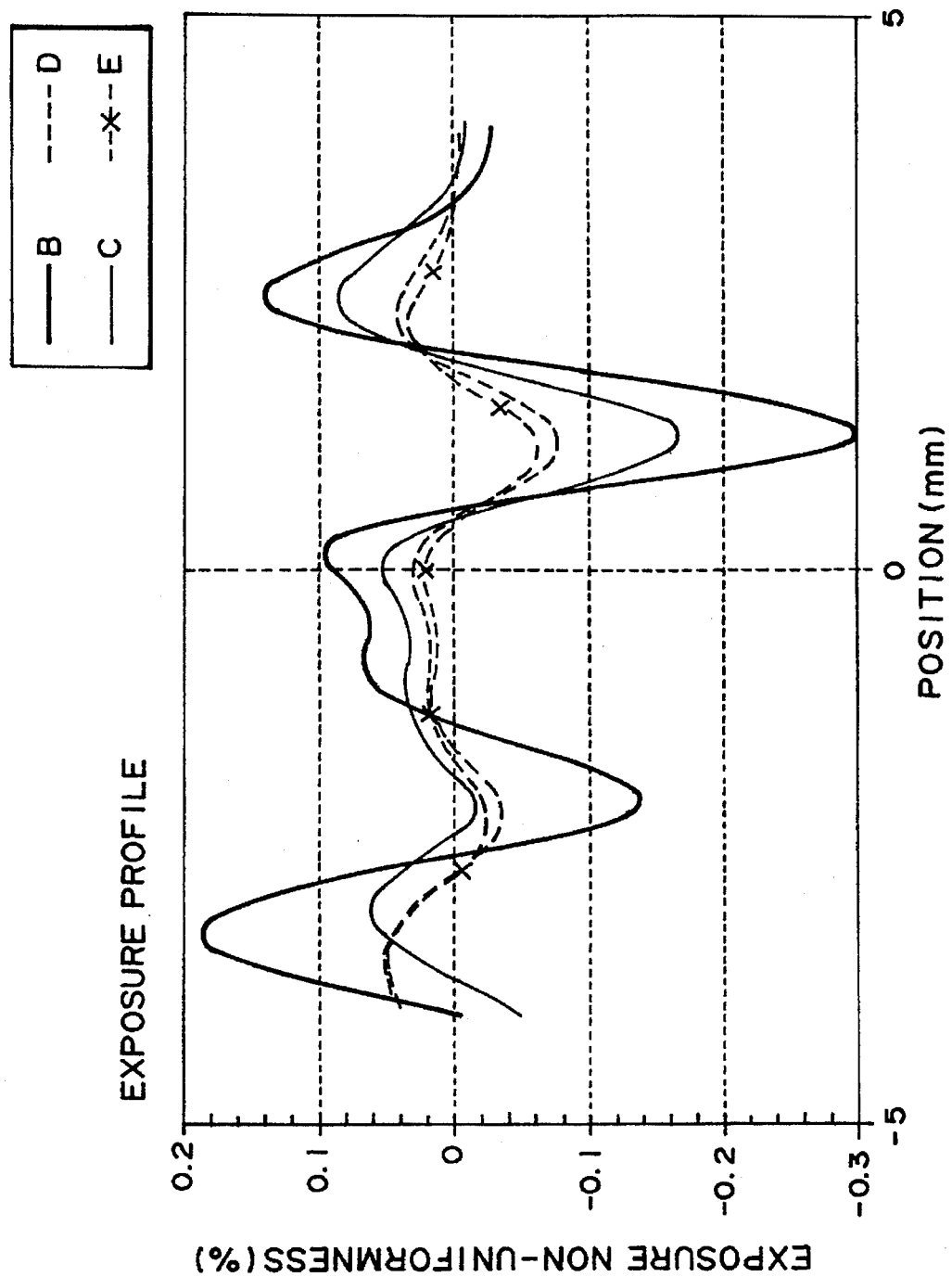
FIG. 5 is a graph for explaining results of exposure control in an occasion where there occurs random variation of emitted light energy from a pulse light source.
Figure 6:
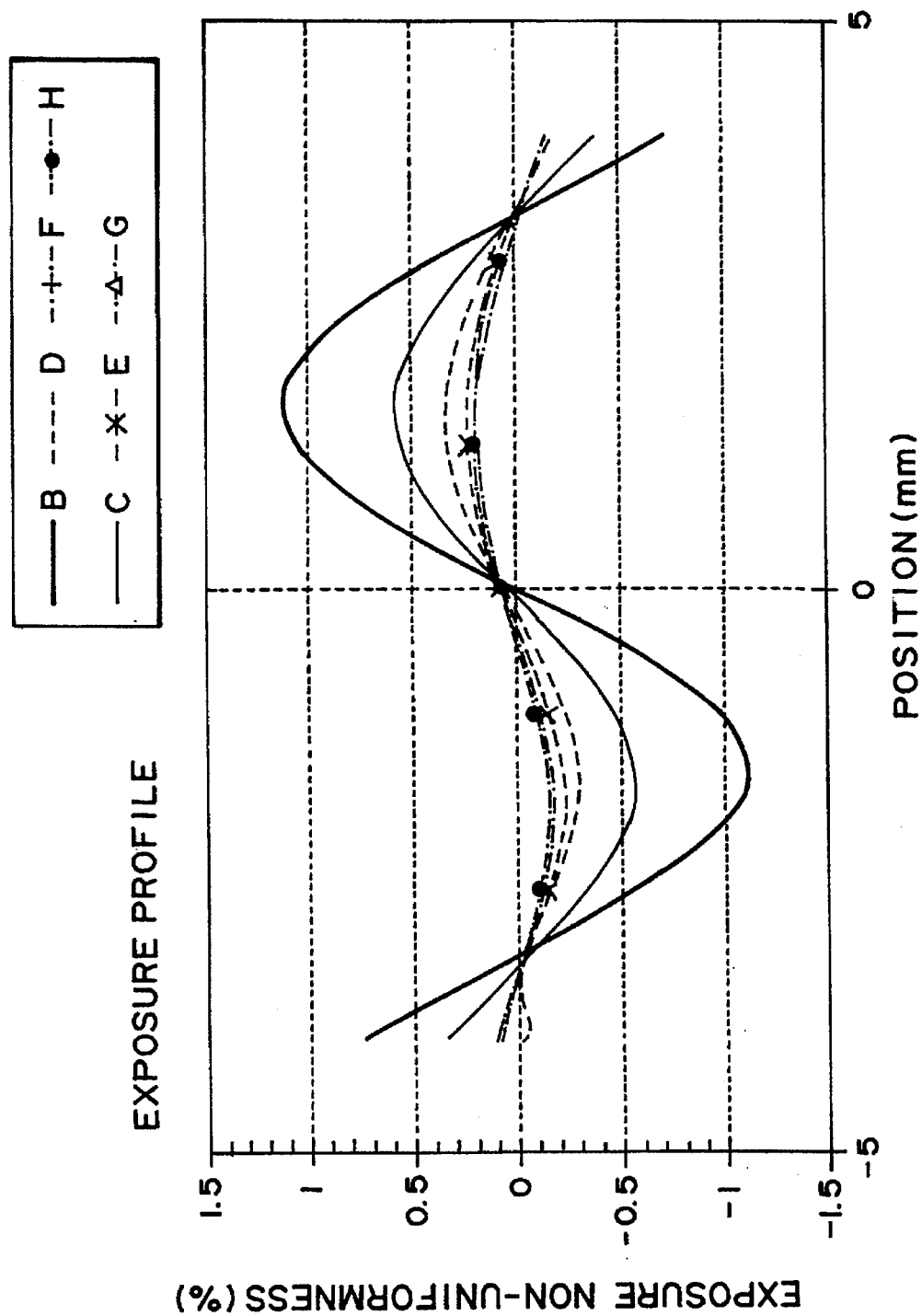
FIG. 6 is a graph for explaining results of exposure control in an occasion where variation of emitted light energy from a pulse light source changes along a sine wave, with time.

Referring now to FIGS. 5 and 6, the correction range "x" will be explained in detail. FIG. 5 illustrates the results of simulation of exposure control in an occasion where there occurs random variation of emission light pulse energy from the pulse light source. FIG. 6 illustrates the results of simulation of exposure control in an occasion where variation of emission light pulse energy from the pulse light source 1 changes in accordance with a sine wave, with lapse of time. In FIG. 5, if a variation of ±1.25% occurs in the emission light pulse energy of the light source in response to an input designated, without the exposure control of the present invention, the resultant non-uniformness of exposure amount of the reticle along the scan direction is depicted by a curve B. Curves C, D and E depict the results of the exposure control of the present invention under the same condition, with different correction ranges of 1, 3 and 5, respectively. Because of the illuminance distribution profile of Gaussian distribution shape shown in FIG. 3 in this embodiment, the correction range may well be of a relatively small value.

In FIG. 6, if, in response to a designated input, the emission light pulse energy from the pulse light source 1 varies (and produces errors) in accordance with a sine wave with the lapse of time, without the exposure control of the present invention, the resultant non-uniformness of exposure amount of the reticle 202 along the scan direction is such as depicted by a curve B. Curves C, D, E, F, G and H depict the results of the exposure control under the same condition, with different correction ranges x of 1, 3, 5, 7, 9 and 11, respectively.

In accordance with this embodiment of the present invention, with respect to each point on the reticle the integrated exposure amount of a point, just being under exposure, is calculated on the basis of the measured data about the emission light pulse energies from the light source 1 and the illuminance distribution profile data of the irradiation region on the reticle with respect to the scan direction, and the emission light pulse energy is controlled to attain a correct exposure amount of that point. By doing so, accurate exposure control as well as correction of non-uniform are accomplished.

Next, another embodiment of the present invention will be explained. Major differences of the present embodiment from the preceding embodiment will be described below. While the preceding embodiment uses profile data storage means 5 which serves to memorize illuminance distribution in the irradiation region on the reticle 202 with respect to the scan direction, in this embodiment the illuminance distribution in the irradiation region on the wafer 206 is memorized into a profile data storage means 5. The correction range "y" in a case of exposure control with notice to the exposure amount upon the wafer 206, may be determined, for example, by the illuminance profile in the irradiation region 213 on the wafer 206 in the scan direction 214, the width of the irradiation region 213 of the wafer 206 in the scan direction 214, the frequency of light emitted by the pulse light source 1, the scan speed of the wafer (wafer stage) and the degree of variation in emission light energy from the pulse light source 1. The range to be taken as the correction range y may be determined as follows:

$$0 < y < d \cdot f/u \quad (3)$$

where d is the width of the irradiation region 213 of the wafer 206 in the scan direction 214, f is the frequency of emitted light, and u is the scan speed. If in this embodiment the projection optical system 204 has a magnification of ¼, then the relations such as:

$$u = v/4 \quad (4)$$

$$d = D/4 \quad (5)$$

are provided. From the relations of equations (4) and (5), it can be seen that the equation (2) is essentially equivalent to equation (2). That is, $$0 < y < D \cdot f/v \quad (6)$$

Thus, accurate exposure (amount) control as attained by the preceding embodiment can be accomplished in this embodiment.

In accordance with this embodiment of the present invention as described above, with respect to each point on the wafer 206, the integrated exposure amount at a point, just being under exposure, is calculated on the basis of the measured data about the emission light pulse energies from the pulse light source 1 and the illuminance distribution profile data about the irradiation region of the wafer 206 with respect to the scan direction 214, and the emission light pulse energy is controlled to attain correct exposure amount of that point. By doing so, accurate exposure amount control as well as correction of non-uniform exposure are accomplished.

Next, an embodiment of device manufacturing method of the present invention, which uses a scanning exposure apparatus described above, will be explained.

Figure 7:
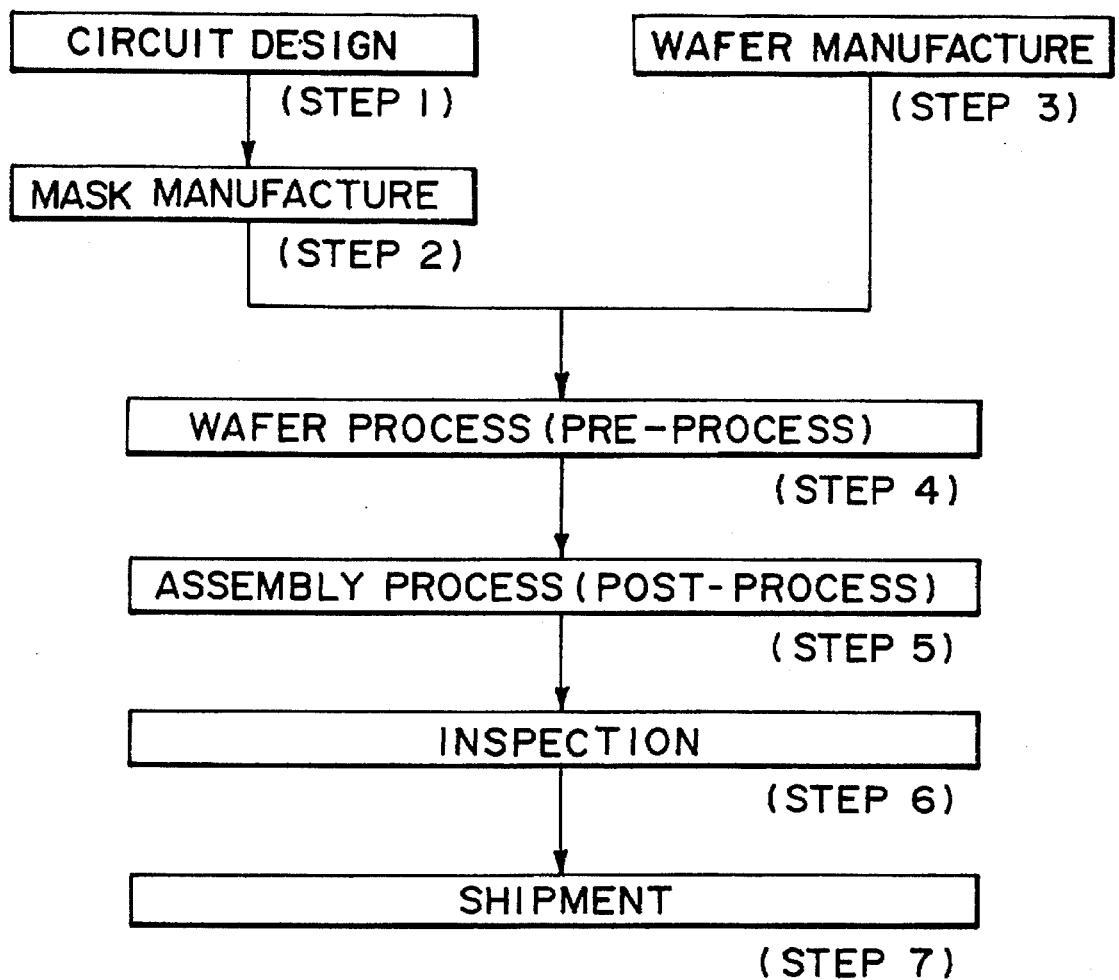
FIG. 7 is a flow chart of semiconductor device manufacturing processes.

FIG. 7 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 8:
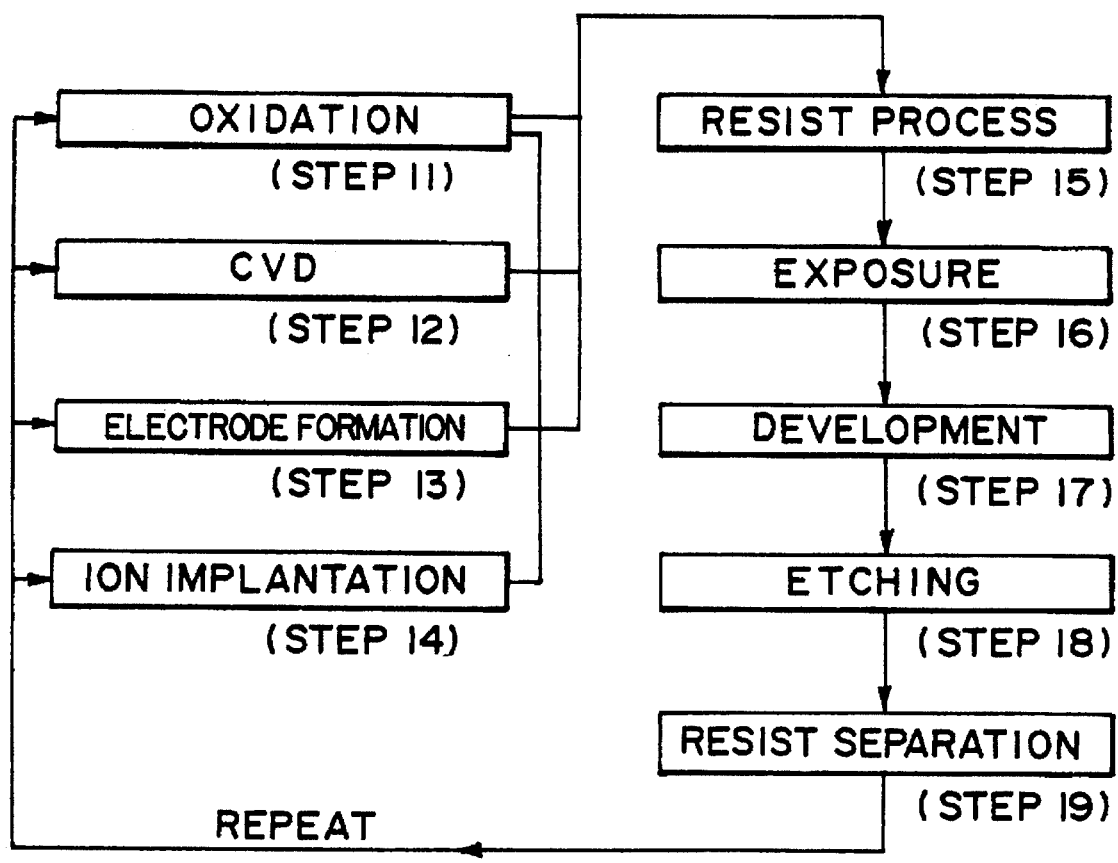
FIG. 8 is a flow chart of a wafer process of FIG. 7.

FIG. 8 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A scanning exposure apparatus for scan exposure of an original and a substrate, for transferring a pattern of the original onto the substrate, said apparatus comprising:

supplying means for supplying exposure light to the substrate through the original during the scan exposure of the original and the substrate, wherein the exposure light illuminates a slit-like region on the substrate which extends in a direction intersecting a scan direction of the substrate, wherein the exposure light has a predetermined intensity distribution within the slit-like region and with respect to the scan direction, and wherein the slit-like region has a width with respect to the scan direction which is smaller than a width of a pattern transfer region on the substrate with respect to the scan direction;

detecting means for detecting light quantity of the exposure light; and control means for controlling said supplying means on the basis of the detected light quantity and the predetermined intensity distribution of the exposure light.

2. An apparatus according to claim 1, wherein the predetermined intensity distribution has a shape of Gaussian distribution.

3. An apparatus according to claim 1, wherein the predetermined intensity distribution has a trapezoidal shape.

4. An apparatus according to claim 1, wherein the predetermined intensity distribution has a peak in a middle portion thereof.

5. An apparatus according to claim 1, wherein the exposure light comprises a plurality of light pulses.

6. An apparatus according to claim 5, wherein the exposure light is supplied by an excimer laser.

7. A scanning exposure apparatus for scan exposure of an original and a substrate, for transferring a pattern of the original onto the substrate, said apparatus comprising:

supplying means for supplying exposure light to the substrate through the original during the scan exposure of the original and the substrate, wherein the exposure light illuminates a slit-like region on the substrate which extends in a direction intersecting a scan direction of the substrate, wherein the exposure light has a predetermined intensity distribution within the slit-like region and with respect to the scan direction, and wherein the slit-like region has a width with respect to the scan direction which is smaller than a width of a pattern transfer region on the substrate with respect to the scan direction;

detecting means for detecting light quantity of the exposure light; and control means for determining an exposure amount applied to the substrate on the basis of the detected light quantity and the predetermined intensity distribution of the exposure light, and for controlling said supplying means on the basis of a difference between a desired exposure amount and the determined exposure amount.

8. An apparatus according to claim 7, wherein said control means controls the intensity of exposure light to be supplied subsequently by said control means, on the basis of the difference.

9. An apparatus according to claim 7, wherein the predetermined intensity distribution has a trapezoidal shape.

10. An apparatus according to claim 7, wherein the predetermined intensity distribution has a peak in a middle portion thereof.

11. An apparatus according to claim 7, wherein the exposure light comprises a plurality of light pulses.

12. An apparatus according to claim 11, wherein the exposure light is supplied by an excimer laser.

13. A scanning exposure apparatus for scan exposure of an original and a substrate, for transferring a pattern of the original onto the substrate, said apparatus comprising:

pulse supplying means for supplying a plurality of light pulses to the substrate through the original during the scan exposure of the original and the substrate, wherein each light pulse illuminates a slit-like region on the substrate which extends in a direction intersecting a scan direction of the substrate, wherein each light pulse has a predetermined intensity distribution within the slit-like region and with respect to the scan direction, and wherein the slit-like region has a width with respect to the scan direction which is smaller that a width of a pattern transfer region on the substrate with respect to the scan direction;

detecting means for detecting light quantity of the light pulses; and control means for determining an integrated exposure amount applied to the substrate with the light pulses, on the basis of the detected light quantity and the predetermined light intensity, and for controlling said pulse supplying means on the basis of a difference between a desired exposure amount and the determined integrated exposure amount.

14. An apparatus according to claim 13, wherein said control means controls the intensity of a light pulse to be projected subsequently by said irradiating means to the mask, on the basis of the difference.

15. An apparatus according to claim 13, wherein the predetermined light intensity distribution has a shape of Gaussian distribution.

16. An apparatus according to claim 13, wherein the predetermined intensity distribution has a trapezoidal shape.

17. An apparatus according to claim 13, wherein the predetermined intensity distribution has a peak in a middle portion thereof.

18. An apparatus according to claim 13, wherein each light pulse is supplied by an excimer laser.

19. An apparatus according to claim 14, wherein said control means controls the intensity of each light pulse corresponding to portions of the substrate along the direction of scan.

20. A device manufacturing method for manufacturing a device by using a scanning exposure apparatus as recited in claim 1.

* * * * *

UNITED STATES PATENT AND TRADEMARK OFFICE
CERTIFICATE OF CORRECTION

PATENT NO. : 5,644,383

DATED : July 1, 1997

INVENTOR(S) : TETSUZO MORI

It is certified that error appears in the above-identified patent and that said Letters Patent is hereby corrected as shown below:

COLUMN 6

Line 34, "reticle" should read --reticle,--.

COLUMN 9

Line 20, "that" should read --than--.

Signed and Sealed this

Thirteenth Day of January, 1998

Attest:

BRUCE LEHMAN

Attesting Officer     Commissioner of Patents and Trademarks